(12) United States Patent
Yang et al.

(10) Patent No.: US 8,334,960 B2
(45) Date of Patent: Dec. 18, 2012

(54) LIQUID CRYSTAL DISPLAY HAVING GATE DRIVER WITH MULTIPLE REGIONS

(75) Inventors: Yong-Ho Yang, Suwon-si (KR); Joo-Sun Yoon, Seoul (KR); Ki-Hun Jeong, Seoul (KR)

(73) Assignee: Samsung Display Co., Ltd. (KR)

( * ) Notice: Subject to any disclaimer, the term of this patent is extended or adjusted under 35 U.S.C. 154(b) by 892 days.

(21) Appl. No.: 11/654,220

(22) Filed: Jan. 16, 2007

(65) Prior Publication Data

US 2007/0164954 A1 Jul. 19, 2007

(30) Foreign Application Priority Data

Jan. 18, 2006 (KR) .................. 10-2006-0005260
Feb. 20, 2006 (KR) .................. 10-2006-0016105

(51) Int. Cl.
*G02F 1/1345* (2006.01)

(52) U.S. Cl. .................. 349/149; 349/152

(58) Field of Classification Search .......... 349/149, 349/151, 153, 152; 345/204
See application file for complete search history.

(56) References Cited

U.S. PATENT DOCUMENTS

| | | | | |
|---|---|---|---|---|
| 5,739,887 | A * | 4/1998 | Ueda et al. | 349/149 |
| 6,583,844 | B1 * | 6/2003 | Mishima et al. | 349/149 |
| 6,774,957 | B2 * | 8/2004 | Jinno et al. | 349/40 |
| 2001/0040547 | A1 * | 11/2001 | Jinno et al. | 345/92 |
| 2001/0050678 | A1 | 12/2001 | Nishikubo et al. | |
| 2004/0183986 | A1 * | 9/2004 | Onda et al. | 349/153 |

FOREIGN PATENT DOCUMENTS

| | | |
|---|---|---|
| CN | 1314671 A | 9/2001 |
| CN | 1319833 A | 10/2001 |
| CN | 1673837 A | 9/2005 |
| EP | 1 139 329 A2 | 10/2001 |
| JP | 9-33933 | 2/1997 |
| JP | 09033933 A * | 2/1997 |
| JP | 10-301124 | 11/1998 |
| JP | 2001-282170 A | 10/2001 |
| JP | 2004-133489 | 4/2004 |
| JP | 2005-258405 | 9/2005 |
| KR | 10-0507299 | 7/2003 |
| KR | 2003-0091334 | 12/2003 |
| KR | 2003-0091571 | 12/2003 |
| KR | 10-0488843 | 5/2005 |

(Continued)

OTHER PUBLICATIONS

Patent Abstracts of Japan, Publication No. 09-033933, Feb. 7, 1997, 1 p.

(Continued)

*Primary Examiner* — Nathanael R Briggs
(74) *Attorney, Agent, or Firm* — Innovation Counsel LLP

(57) ABSTRACT

A liquid crystal display according to an exemplary embodiment of the present invention includes a substrate, a plurality of pixels arranged in a matrix on the substrate where each pixel includes a switching element, a plurality of gate lines that are connected to the switching elements and extend in a row direction, and a gate driver that is connected to the gate lines and is formed on the substrate as an integrated circuit. In the liquid crystal display, the gate driver includes a first region and a second region that is not aligned with the first region.

42 Claims, 11 Drawing Sheets

FOREIGN PATENT DOCUMENTS

KR    10-2005-0094282    9/2005

OTHER PUBLICATIONS

Patent Abstracts of Japan, Publication No. 10-301124, Nov. 13, 1998, 1 p.

Patent Abstracts of Japan, Publication No. 2004-133489, Apr. 30, 2004, 1 p.

Patent Abstracts of Japan, Publication No. 2005-258405, Sep. 22, 2005, 1 p.

Korean Patent Abstracts, Publication No. 1020030060765, Jul. 16, 2003, 1 p.

Korean Patent Abstracts, Publication No. 1020030091334, Dec. 3, 2003, 1 p.

Korean Patent Abstracts, Publication No. 1020030091571, Dec. 3, 2003, 2 pp.

Korean Patent Abstracts, Publication No. 10-0488843, May 2, 2005, 1 p.

Korean Patent Abstracts, Publication No. 1020050094282, Sep. 27, 2005, 1 p.

\* cited by examiner

LIQUID CRYSTAL DISPLAY HAVING GATE DRIVER WITH MULTIPLE REGIONS

CROSS-REFERENCE TO RELATED APPLICATIONS

This application claims priority to and the benefit of Patent Application Nos. 10-2006-0005260 and 10-2006-0016105 that were respectively filed in the Korean Intellectual Property Office, Republic of Korea, on Jan. 18, 2006, and Feb. 20, 2006, the entire contents of which are incorporated by reference.

BACKGROUND OF THE INVENTION (a) Field of the Invention

The present invention relates to display devices, and more particularly to a liquid crystal display.

(b) Description of the Related Art

A liquid crystal display is one type of flat panel display that has come into widespread use in recent years. Liquid crystal displays typically include two display panels on which electric field generating electrodes, such as pixel electrodes and a common electrode, are formed, with a liquid crystal layer interposed therebetween. In the liquid crystal display, when a voltage is applied to the electric field generating electrodes, an electric field is generated in the liquid crystal layer. The orientation of liquid crystal molecules within the liquid crystal layer is determined and the polarization of incident light is controlled by the electric field, thereby displaying a desired image.

Liquid crystal displays typically include switching elements connected to the pixel electrodes and a plurality of signal lines, such as gate lines and data lines, for controlling the switching elements to apply a voltage to the pixel electrodes. The gate lines transmit gate signals generated by a gate driving circuit, and the data lines transmit a data voltage generated by a data driving circuit. In addition, the switching elements transmit the data voltage to the pixel electrodes on the basis of the gate signals. The gate driver and the data driver may be mounted to the display panel in the form of a chip. However, in recent years, the gate driver has been integrated into the display panel in order to reduce the overall size of a display device and to improve the productivity thereof.

The above information disclosed in this Background section is only for enhancement of understanding of the background of the invention and therefore it may contain information that does not form the prior art that is already known in this country to a person of ordinary skill in the art.

SUMMARY OF THE INVENTION

Embodiments of the present invention address the need for a liquid crystal display capable of effectively protecting an integrated display panel gate driver from the external environment. According to an exemplary embodiment of the present invention, a liquid crystal display includes a substrate, a plurality of pixels arranged in a matrix on the substrate where each pixel includes a switching element, a plurality of gate lines that are connected to the switching elements and extend in a row direction, and a gate driver that is connected to the gate lines and is formed on the substrate as an integrated circuit. In the liquid crystal display, the gate driver includes a first region and a second region that is not aligned with the first region.

In the above-mentioned embodiment, the second region may include a third region and a fourth region arranged at both sides of the first region. A first distance between the first region and the pixels may be greater than a second distance between the second region and the pixels. The gate driver may include a first gate driver that is connected to odd-numbered gate lines among the gate lines and a second gate driver that is connected to even-numbered gate lines among the gate lines. The first gate driver and the second gate driver may be disposed opposite to each other with the pixels interposed therebetween.

In the above-mentioned embodiment, the gate driver may include a plurality of circuit portions connected to the gate lines and a plurality of wiring portions that are connected to the circuit portions where each of the wiring portions has a plurality of wiring lines for transmitting signals. At least two of the plurality of circuit portions may be arranged in a line, and at least another one of the plurality of circuit portions may not be aligned with the at least two of the plurality of circuit portions arranged in a line. The wiring lines may be bent in the first and second regions. The embodiment may further include a sealant that is formed so as to surround the pixels. The sealant may cover the gate driver. The sealant may cover all the wiring lines of the gate driver. A distance between the wiring portion of the first region and the wiring portion of the second region may be smaller than 300 μm(micrometers).

According to another exemplary embodiment of the present invention, a liquid crystal display includes a substrate, a plurality of pixels arranged in a matrix on the substrate where each pixel inclues a switching element, a plurality of gate lines that are connected to the switching elements and extend in a row direction, a gate driver that is connected to the gate lines and is formed on the substrate as an integrated circuit, and a sealant that covers the gate driver. In the liquid crystal display, the gate driver includes a first region and a second region that is not aligned with the first region.

According to still another exemplary embodiment of the present invention, a liquid crystal display includes a substrate, a display area in which a plurality of pixels arranged in a matrix on the substrate where each pixel includes a switching element, a plurality of gate lines that are connected to the switching elements and extend in a row direction, a sealant that is formed so as to surround the plurality of pixels and includes at least one edge portion, and a gate driver that is formed on the substrate as an integrated circuit and is covered with the sealant. In the liquid crystal display, the gate driver is formed in portions other than the edge portion of the sealant.

In the above-mentioned embodiment, the gate driver may include a plurality of main gate driving circuits that transmit gate signals to the gate lines, and a plurality of sub gate driving circuits that assist the operation of the main gate driving circuits. The main gate driving circuits may be positioned at a side of the display area, and the sub gate driving circuits may be positioned at one of an upper or lower side of the display area. The main gate driving circuits and the sub gate driving circuits may include circuit portions connected to the gate lines and wiring portions connected to the circuit portions respectively, where the wiring portion of the main gate driving circuits may be connected to the wiring portion of the sub gate driving circuits. The main gate driving circuits may include a first portion connected to an odd-numbered gate line among the gate lines and a second portion connected to an even-numbered gate line among the gate lines. The first portion and the second portion may be disposed opposite to each other with the display area interposed therebetween.

The scope of the invention is defined by the claims, which are incorporated into this section by reference. A more complete understanding of embodiments of the invention will be afforded to those skilled in the art, as well as a realization of additional advantages thereof, by a consideration of the following detailed description. Reference will be made to the appended sheets of drawings that will first be described briefly.

DETAILED DESCRIPTION OF THE EMBODIMENTS

Figure 1:
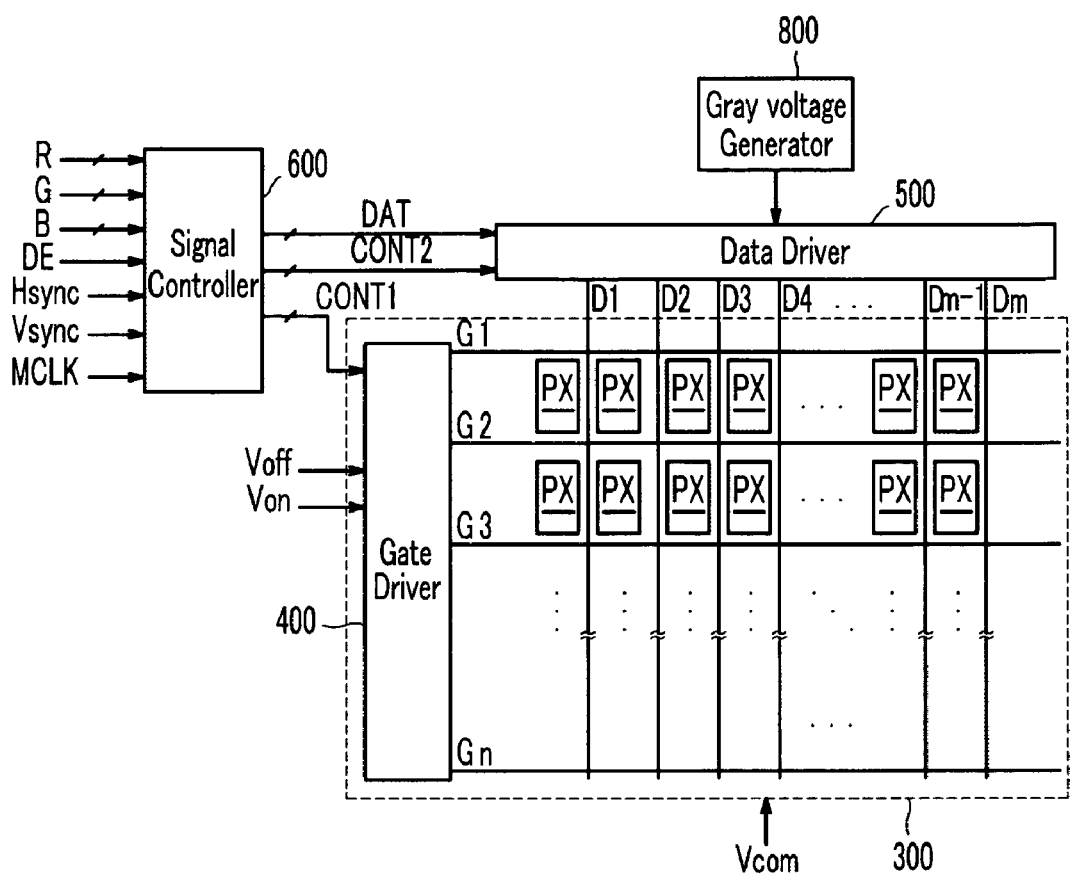
FIG. 1 is a block diagram illustrating a liquid crystal display according to an exemplary embodiment of the present invention.

Embodiments of the present invention will now be described more fully hereinafter with reference to the accompanying drawings, in which preferred embodiments of the invention are shown. As those skilled in the art would realize, the described embodiments may be modified in various ways, all without departing from the spirit or scope of the present invention. In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
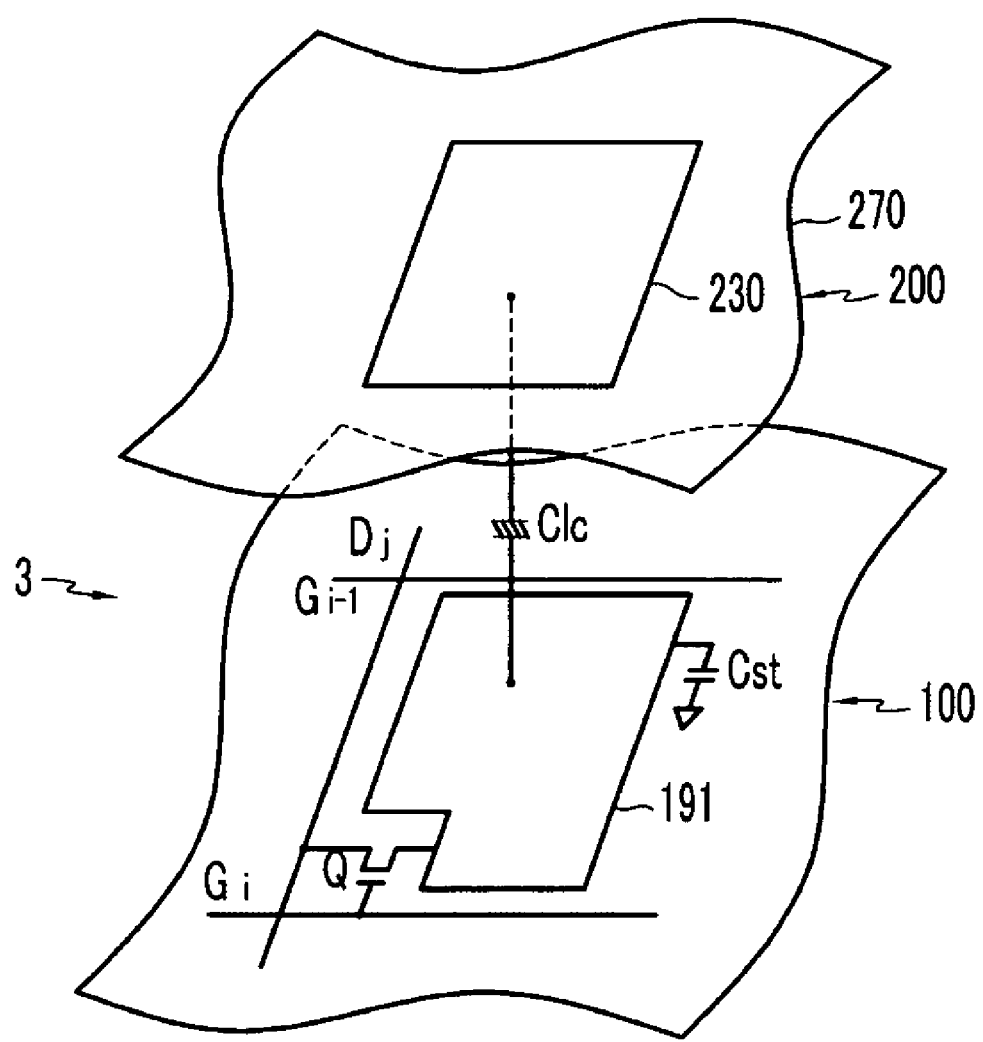
FIG. 2 is an equivalent circuit diagram illustrating one pixel of a liquid crystal display according to an exemplary embodiment of the present invention.

First, a liquid crystal display according to an exemplary embodiment of the present invention will be described below with reference to FIGS. 1 and 2. The term exemplary herein describes an example embodiment and not necessarily an ideal embodiment. FIG. 1 is a block diagram illustrating a liquid crystal display according to an exemplary embodiment of the present invention, and FIG. 2 is an equivalent circuit diagram illustrating a pixel of the liquid crystal display according to the exemplary embodiment of the present invention. As shown in FIGS. 1 and 2, the liquid crystal display according to the exemplary embodiment of the present invention includes a liquid crystal panel assembly 300, a pair of a gate driver 400 and a data driver 500 connected to the liquid crystal panel assembly 300, a gray voltage generator 800 connected to the data driver 500, and a signal controller 600 for controlling the above elements.

In the equivalent circuit diagram, the liquid crystal panel assembly 300 includes a plurality of signal lines $G_1$ to $G_n$ and $D_1$ to $D_m$ and a plurality of pixels PX that are connected to the plurality of signal lines and are substantially arranged in a matrix configuration. As shown in FIG. 2, the liquid crystal panel assembly 300 includes lower and upper panels 100 and 200 facing each other and a liquid crystal layer 3 interposed therebetween. The signal lines include a plurality of gate lines $G_1$ to $G_n$ for transmitting gate signals (also referred to as "scanning signals") and a plurality of data lines $D_1$ to $D_m$ for transmitting data signals. The gate lines $G_1$ to $G_n$ extend substantially in a row direction and are substantially parallel to each other, while the data lines $D_1$ to $D_m$ extend substantially in a column direction and also are substantially parallel to each other. Each pixel PX includes a switching element Q connected to one of the signal lines, a liquid crystal capacitor Clc connected to the switching element Q, and a storage capacitor Cst. The storage capacitor Cst may be omitted. The switching element Q is a three-terminal element, such as a thin film transistor, and is disposed on the lower panel 100. A control terminal of the switching element Q is connected to a gate line $G_i$, an input terminal thereof is connected to a data line $D_j$, and an output terminal thereof is connected to the liquid crystal capacitor Clc and the storage capacitor Cst.

The liquid crystal capacitor Clc has as two terminals a pixel electrode 191 of the lower panel 100 and a common electrode 270 of the upper panel 200, and also has the liquid crystal layer 3 between the two electrodes 191 and 270 as a dielectric material. The pixel electrode 191 is connected to the switching element Q, and the common electrode 270 covers an entire surface of the upper panel 200 and is supplied with a common voltage Vcom. Unlike the structure shown in FIG. 2, the common electrode 270 may be provided on the lower panel 100. In this case, at least one of the two electrodes 191 and 270 may have a shape of bar or stripe. The storage capacitor Cst, serving as an auxiliary capacitor of the liquid crystal capacitor Clc, is composed of a signal line (not shown) provided on the lower panel 100, the pixel electrode 191, and an insulator interposed therebetween. A predetermined voltage, such as a common voltage Vcom, is applied to the signal line. Alternatively, the storage capacitor Cst may be a laminated structure of the pixel electrode 191, the insulator, and a previous gate line formed on the insulator.

Meanwhile, in order to perform color display, each pixel PX specifically displays one primary color (spatial division), or the pixels PX alternately display the primary colors over time (temporal division), which causes the primary colors to be spatially or temporally synthesized, thereby displaying a desired color. An example of a set of the primary colors may be composed of, for example, red, green, and blue. As an example of the spatial division, FIG. 2 shows that each pixel PX has a color filter 230 for displaying one of the primary colors in a region of the upper panel 200 corresponding to the pixel electrode 191. Alternatively, the structure shown in FIG. 2, the color filter 230 may be provided on or under the pixel electrode 191 of the lower panel 100. One or more polarizers (not shown) for polarizing light are attached to the outer surface of the liquid crystal panel assembly 300.

Referring to FIG. 1 again, the gray voltage generator 800 generates a full number of gray voltages or a limited number of gray voltages (referred to as "reference gray voltages" hereinafter) related to the transmittance of the pixels PX. Some of the (reference) gray voltages have a positive polarity relative to the common voltage Vcom, while the other of the (reference) gray voltages have a negative polarity relative to the common voltage Vcom. The gate driver 400 is connected to the gate lines $G_1$ to $G_n$ of the liquid crystal panel assembly 300, and synthesizes a gate-on voltage Von and a gate-off voltage Voff to generate the gate signals for application to the gate lines $G_1$-$G_n$. The gate driver 400 substantially serves as a shift register, and includes a plurality of stages arranged in a line. The gate driver 400 is formed and integrated into the liquid crystal panel assembly 300 together with the signal lines $G_1$ to $G_n$ and $D_1$ to $D_m$ and the thin film transistor switching elements Q by the same process. The data driver 500 is connected to the data lines $D_1$ to $D_m$ of the liquid crystal panel assembly 300, selects the gray voltage generated by the gray voltage generator 800, and supplies the selected gray voltage to the data lines $D_1$ to $D_m$ as a data signal. However, when the gray voltage generator 800 generates only a reduced number of the reference gray voltages instead of all the gray voltages, the data driver 500 may divide the reference gray voltages to generate the data voltages among the gray voltages. The signal controller 600 controls, for example, the gate driver 400 and the data driver 500.

Each of the drivers 500, 600, and 800 may be directly mounted on the liquid crystal panel assembly 300 in the form of at least one IC chip, may be mounted on a flexible printed circuit film (not shown) and then mounted on the liquid crystal panel assembly 300 in the form of a tape carrier package (TCP), or may be mounted on a separate printed circuit board (not shown). Alternatively, the drivers 500, 600, and 800 may be integrated with the liquid crystal panel assembly 300 together with, for example, the signal lines $G_1$ to $G_n$ and $D_1$ to $D_m$ and the thin film transistor switching elements Q. The drivers 500, 600, and 800 may be integrated into a single chip. In this case, at least one of the drivers or at least one circuit forming the drivers may be arranged outside the single chip.

Figure 3:
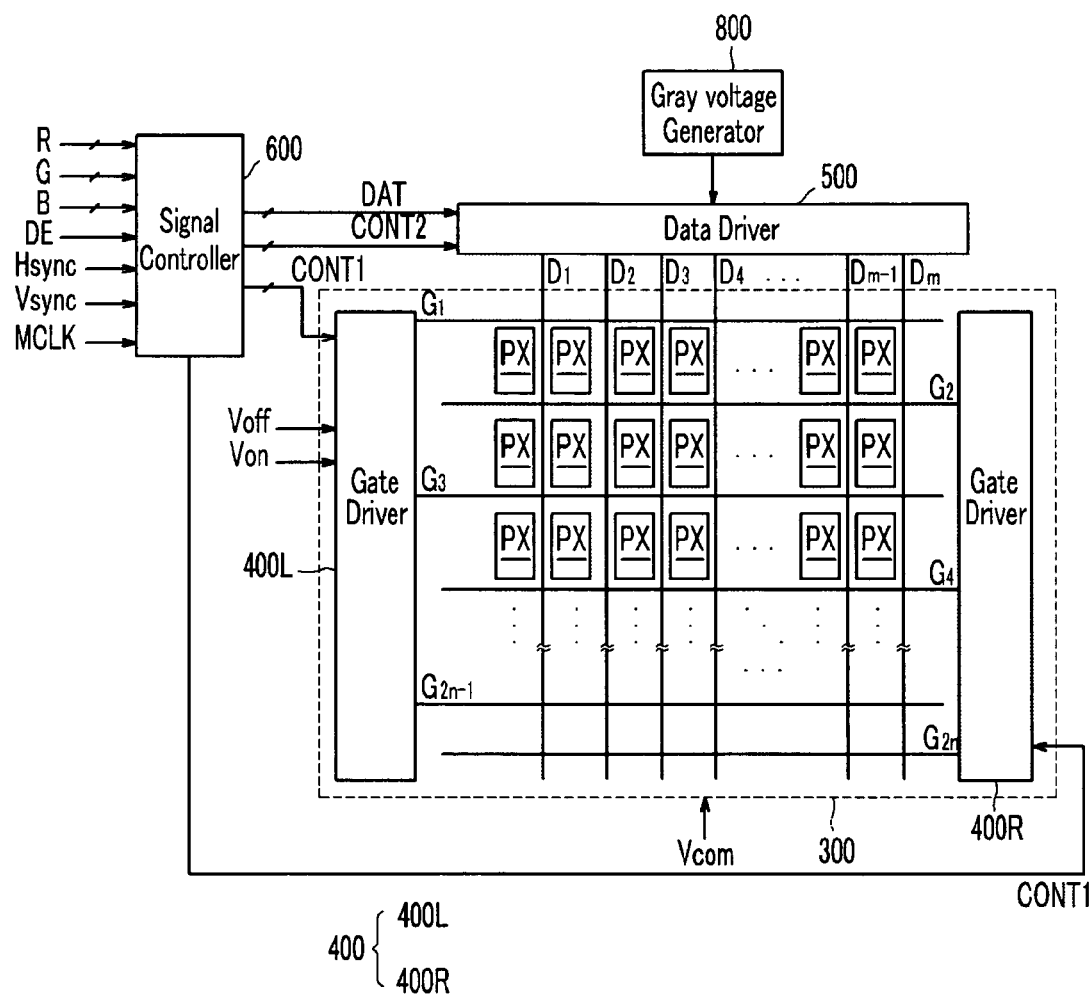
FIG. 3 is a block diagram illustrating a liquid crystal display according to another exemplary embodiment of the present invention.

Next, a liquid crystal display according to another exemplary embodiment of the present invention will be described with reference to FIG. 3. FIG. 3 is a block diagram illustrating a liquid crystal display according to another exemplary embodiment of the present invention. Referring to FIG. 3, the liquid crystal display according to the present exemplary embodiment includes a liquid crystal panel assembly 300, a gate driver 400 and a data driver 500 connected to the liquid crystal panel assembly 300, a gray voltage generator 800 connected to the data driver 500, and a signal controller 600 for controlling these components.

The liquid crystal display shown in FIG. 3 differs from the liquid crystal display shown in FIG. 1 in that a pair of gate lines $G_1$ to $G_{2n}$ is arranged for each row of pixels. The gate driver 400 is divided into first and second gate drivers 400L and 400R disposed on the left and right sides of the liquid crystal panel 300. The first gate driver 400L is connected to odd-numbered gate lines $G_1, G_3, \ldots, G_{2n-1}$, and the second gate driver 400R is connected to even-numbered gate lines $G_2, G_4, \ldots, G_{2n}$. However, this is not considered limiting. For example, odd-numbered gate lines $G_1, G_3, \ldots, G_{2n-1}$ may be connected to the second gate driver 400R, and even-numbered gate lines $G_2, G_4, \ldots, G_{2n}$ may be connected to the first gate driver 400L. The first and second gate drivers 400L and 400R are connected to the gate lines $G_1$ to $G_{2n}$ of the liquid crystal panel assembly 300, and supply gate signals, each synthesizes a gate-on voltage Von and a gate-off voltage Voff to generate the gate signals for application to the gate lines $G_1$-$G_{2n}$. In this way, it is possible to supply the gate signals to the gate lines $G_1$ to $G_{2n}$ from both sides of the liquid crystal panel assembly 300, which prevents the gate signals from being delayed at one side of each of the gate lines $G_1$ to $G_{2n}$. Therefore, it is possible to effectively transmit the gate signals through all the gate lines $G_1$ to $G_{2n}$.

Next, the operation of the liquid crystal display will be described in detail below. The signal controller 600 is supplied with input image signals R, G, and B and input control signals for displaying the input image signals from an external graphic controller (not shown). The input image signals R, G and B contain luminance information of pixels PX where the luminance has a predetermined number of grays or gray levels, for example, $1024 (=2^{10})$, $256 (=2^8)$, or $64 (=2^6)$ grays. The input control signals include a vertical synchronization signal Vsync, a horizontal synchronization signal Hsync, a main clock signal MCLK, and a data enable signal DE.

The signal controller 600 processes the input image signals R, G, and B so as to be suitable for the operational conditions of the liquid crystal panel assembly 300 on the basis of the input control signal, and generates, for example, a gate control signal CONT1 and a data control signal CONT2. Then, the signal controller 600 transmits the gate control signal CONT1 to the gate driver 400 and transmits the data control signal CONT2 and the processed image signal DAT to the data driver 500. The gate control signal CONT1 includes a scanning start signal STV for instructing to start scanning and at least one clock signal for controlling the output cycle of the gate-on voltage Von. The gate control signal CONT1 may further include an output enable signal OE for defining the duration of the gate-on voltage Von. The data control signal CONT2 includes a horizontal synchronization start signal STH for informing of start of data transmission for a row (group) of pixels PX starts, a load signal LOAD for instructing to apply the data voltages to the data lines $D_1$ to $D_m$, and a data clock signal HCLK. The data control signal CONT2 may further include an inversion signal RVS for reversing the polarity of the voltage of a data signal with respect to the common voltage Vcom (hereinafter, "the polarity of the voltage of a data signal with the common voltage" is simply referred to as "the polarity of a data signal").

The data driver 500 receives the digital image signal DAT for a row (group) of pixels PX in response to the data control signal CONT2 transmitted from the signal controller 600, selects a gray voltage corresponding to each digital image signal DAT, converts the digital image signal DAT into an analog data signal, and supplies the analog data signal to the corresponding data lines $D_1$ to $D_m$. The gate driver 400 applies the gate-on voltage Von to the gate lines $G_1$ to $G_{2n}$ in response to the gate control signal CONT1 from the signal controller 600 to turn on the switching elements Q connected to the gate lines $G_1$ to $G_{2n}$. Then, the data signals applied to the data lines $D_1$ to $D_m$ are supplied to the corresponding pixels PX through the switching elements Q that are in an on state. The difference between the voltage of the data signal applied to the pixel PX and the common voltage Vcom is a charging voltage of the liquid crystal capacitor Clc, that is, a pixel voltage. The alignment directions of liquid crystal molecules depend on the level of the pixel voltage, which causes the polarization of light passing through the liquid crystal layer 3 to vary. The variation in polarization causes a variation in the transmittance of light by the polarizer mounted on the liquid crystal panel assembly 300.

These processes are repeatedly performed for every one horizontal period (which is referred to as "1H" and is equal to one period of the horizontal synchronization signal Hsync and the data enable signal DE). In this way, the gate-on voltage Von is sequentially applied to all the gate lines $G_1$ to $G_{2n}$, and the data signals are supplied to all the pixels PX, thereby displaying one frame of images. When one frame has ended, the next frame starts. In this case, the state of the inversion signal RVS applied to the data driver 500 is controlled such that the polarity of the data signal applied to each pixel PX is opposite to the polarity of the data signal in the previous frame ("frame inversion"). The polarity of the data signal applied to one data line may be inverted in the same frame according to the characteristic of the inversion signal RVS (for example, row inversion and dot inversion), and the polarities of the data signals applied to a row of pixels may be different from each other (for example, column inversion and dot inversion).

Figure 4:
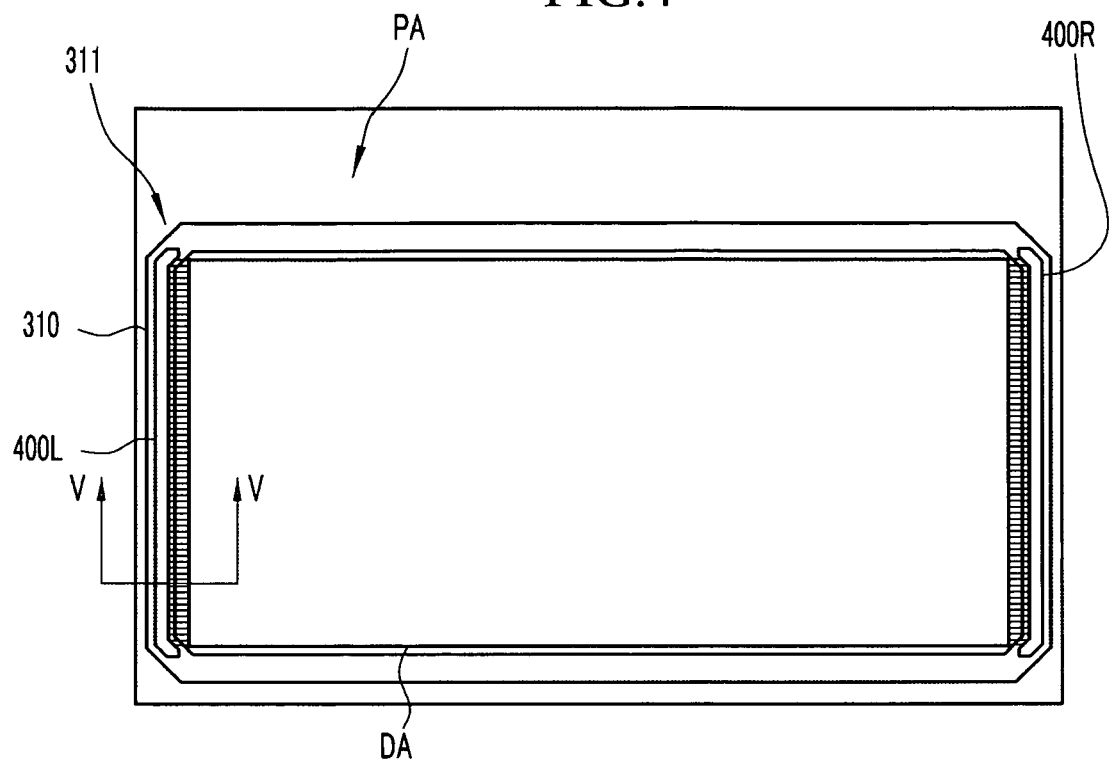
FIG. 4 is a plan view illustrating a liquid crystal panel assembly according to an exemplary embodiment of the present invention.

Next, a liquid crystal panel assembly according to an exemplary embodiment of the present invention and a gate driver formed in the liquid crystal panel assembly will be described in detail with reference to FIGS. 4 to 9. FIG. 4 is a top plan view illustrating a liquid crystal panel assembly according to an exemplary embodiment of the present invention, FIG. 5 is a cross-sectional view of the liquid crystal panel assembly taken along the line V-V of FIG. 4, and FIG. 6 is a top plan view illustrating in detail an edge of the liquid crystal panel assembly shown in FIG. 4.

Figure 5:
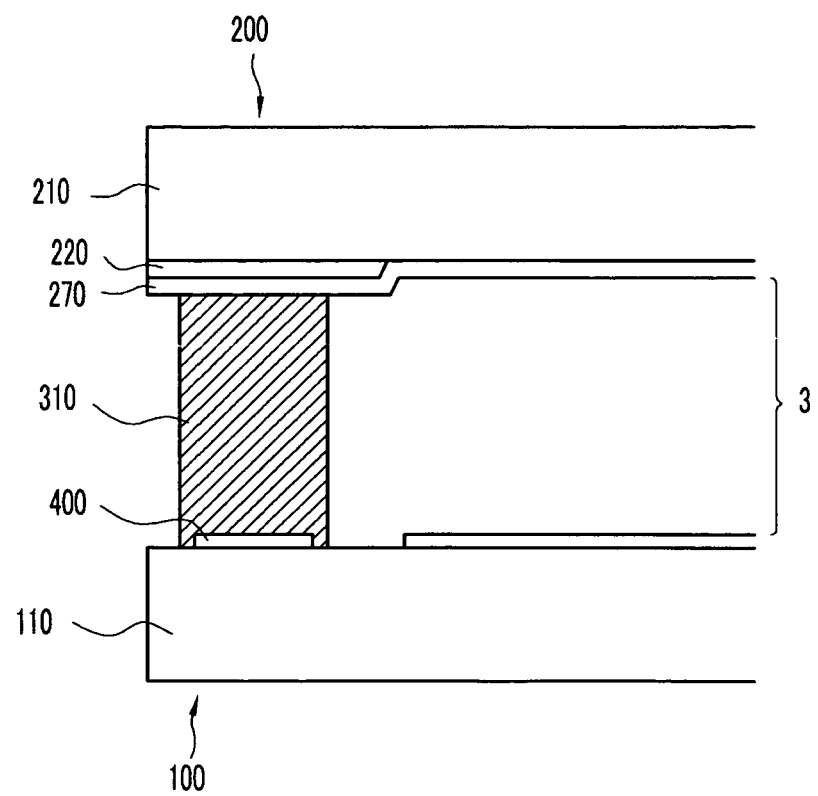
FIG. 5 is a cross-sectional view of the liquid crystal panel assembly shown in FIG. 4 taken along the line V-V.
Figure 6:
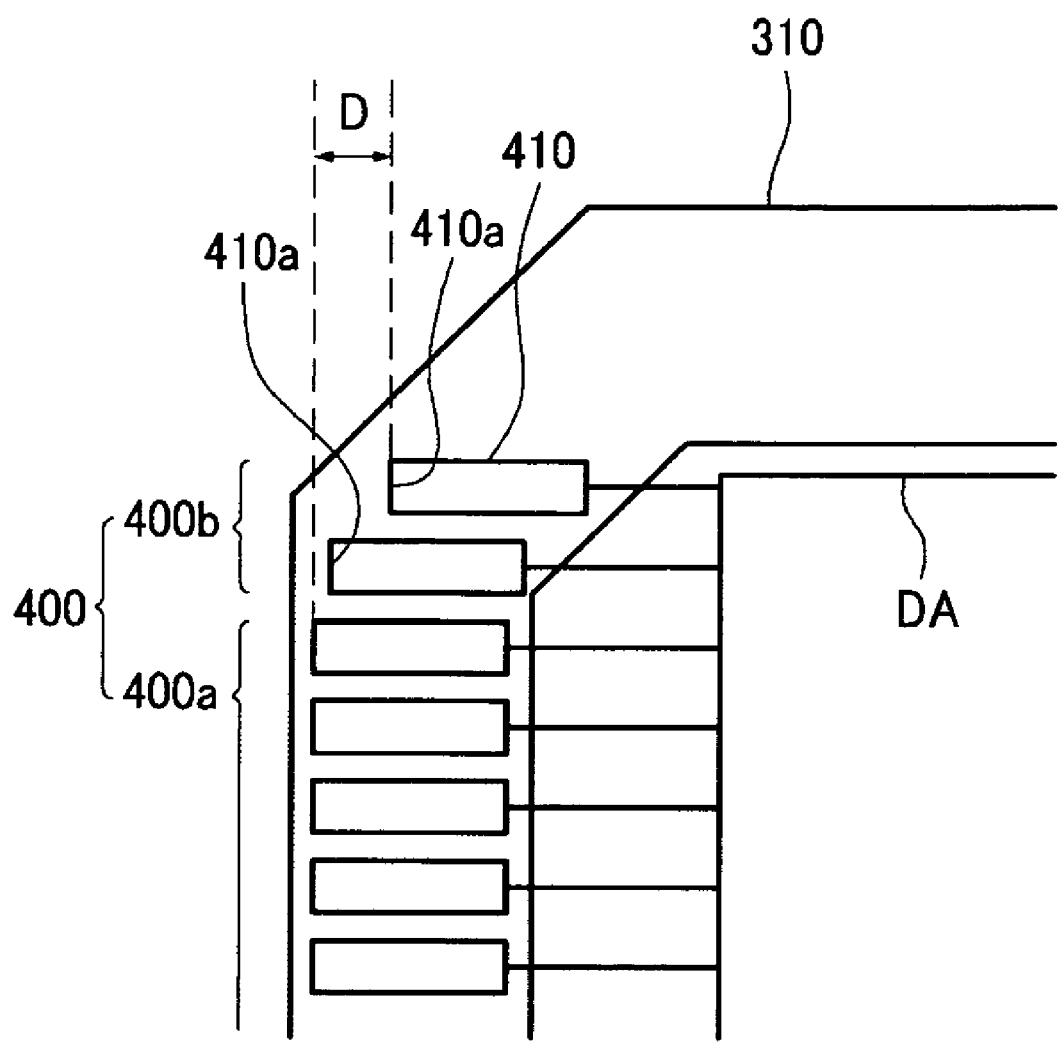
FIG. 6 is a plan view illustrating in detail a portion of the liquid crystal panel assembly shown in FIG. 4.

Referring to FIG. 4 to FIG. 6, a liquid crystal panel assembly according to an exemplary embodiment of the present invention includes a thin film transistor array panel 100, a common electrode panel 200 (refer to FIG. 1) a liquid crystal layer 3 (refer to FIG. 1) interposed between the two display panels 100 and 200, and a sealant 310 for sealing the liquid crystal layer 3. The liquid crystal panel assembly 300 has a display area DA and a peripheral area PA disposed at one side of the display area DA. The data driver 500 connected to the data lines $D_1$ to $D_m$ is mounted in the peripheral area PA of a substrate 110. For example, the gate lines $G_1$ to $G_n$, the data lines $D_1$ to $D_m$ intersecting the gate lines $G_1$ to $G_n$, thin film transistors (not shown) connected to the gate lines $G_1$ to $G_n$ and the data lines $D_1$ to $D_m$, and pixel electrodes 191 connected to the thin film transistors are formed in the display area DA of the substrate 110.

The gate drivers 400 are integrated at both sides of the display area DA. Each of the gate drivers 400 has a plurality of gate driving circuits 410. Each of the gate drivers 400 includes a first region 400a in which the gate driving circuits 410 are arranged in a line and second regions 400b that are not aligned with the first region 400a. The second regions 400b are arranged at the upper and lower sides of the first region 400a. In the second regions 400b, at least one of the gate driving circuits 410 is arranged closer to the display area DA than the gate driving circuits 410 of the first region 400a. It is preferable that a distance D between the uppermost gate driving circuit 410 of the second region 400b and the gate driving circuits 410 of the first region 400a be smaller than 300 μm (micrometers). A sealant 310 is formed in the periphery of the display area DA, and edge portions 311 of the sealant 310 are rounded or chamfered, in view of a subsequent process. The position of the second regions 400b of the gate driver 400 is substantially identical to that of the edge portions 311 of the sealant 310. Therefore, the gate driver 400 is covered with the sealant 310. In this way, it is possible to prevent the gate driver 400 from being exposed to the air, water and other material generated in a process etc and thereby corroded. Particularly, portions 410a of the gate driver 400 opposite to the display area DA, including the edge portions 311 of the sealant 310, are covered with the sealant 310. The common electrode panel 200 is bonded to the thin film transistor array panel 100 by the sealant 310. A light shielding layer 220 is formed on a substrate 210 of the common electrode panel 200, and the common electrode 270 is formed on the light shielding layer 220. Color filters (not shown) may be formed between the substrate 210 and the common electrode 270. Alternatively, the color filters may be formed on the thin film transistor array panel 100.

Figure 7:
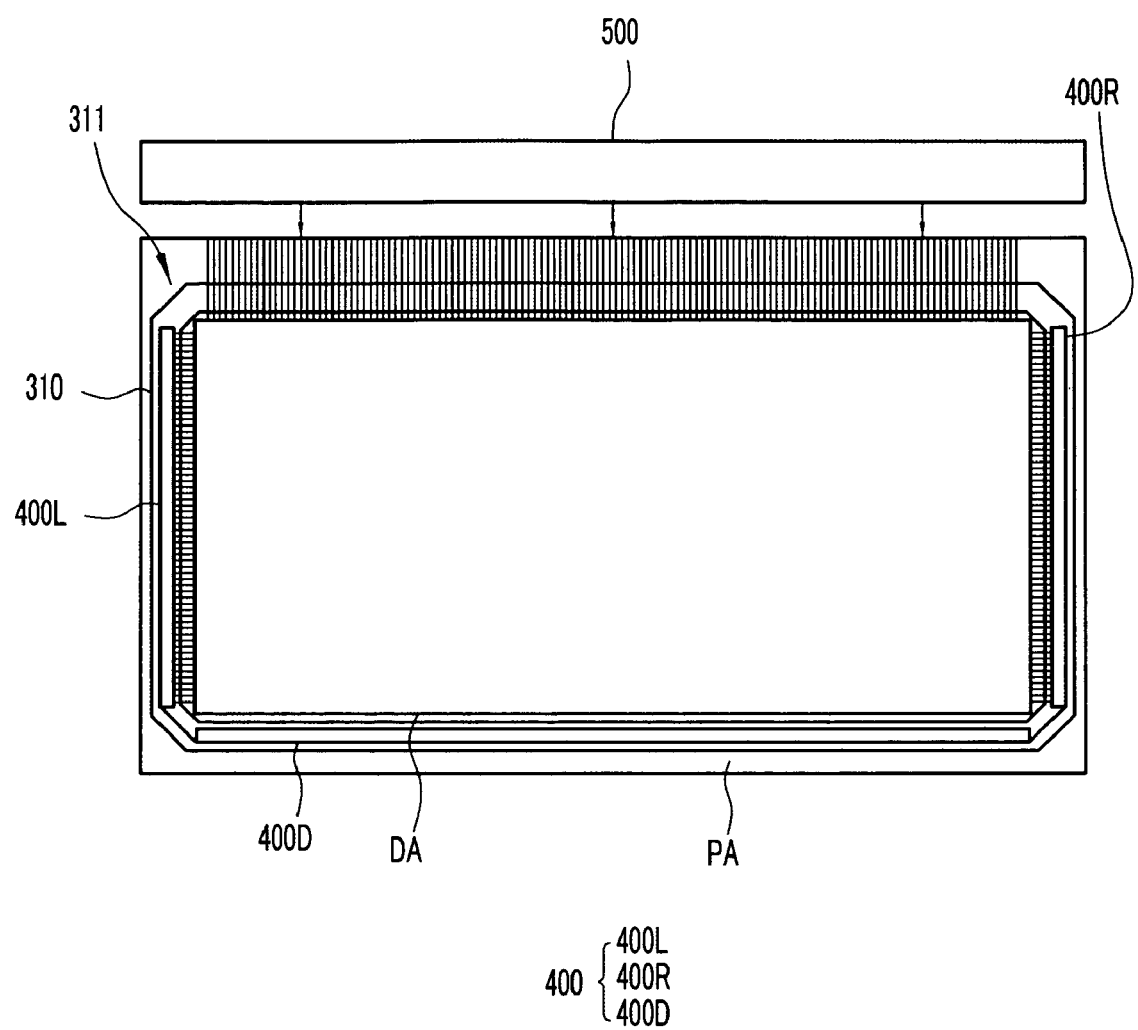
FIG. 7 is a plan view illustrating a liquid crystal panel assembly according to another exemplary embodiment of the present invention.
Figure 8:
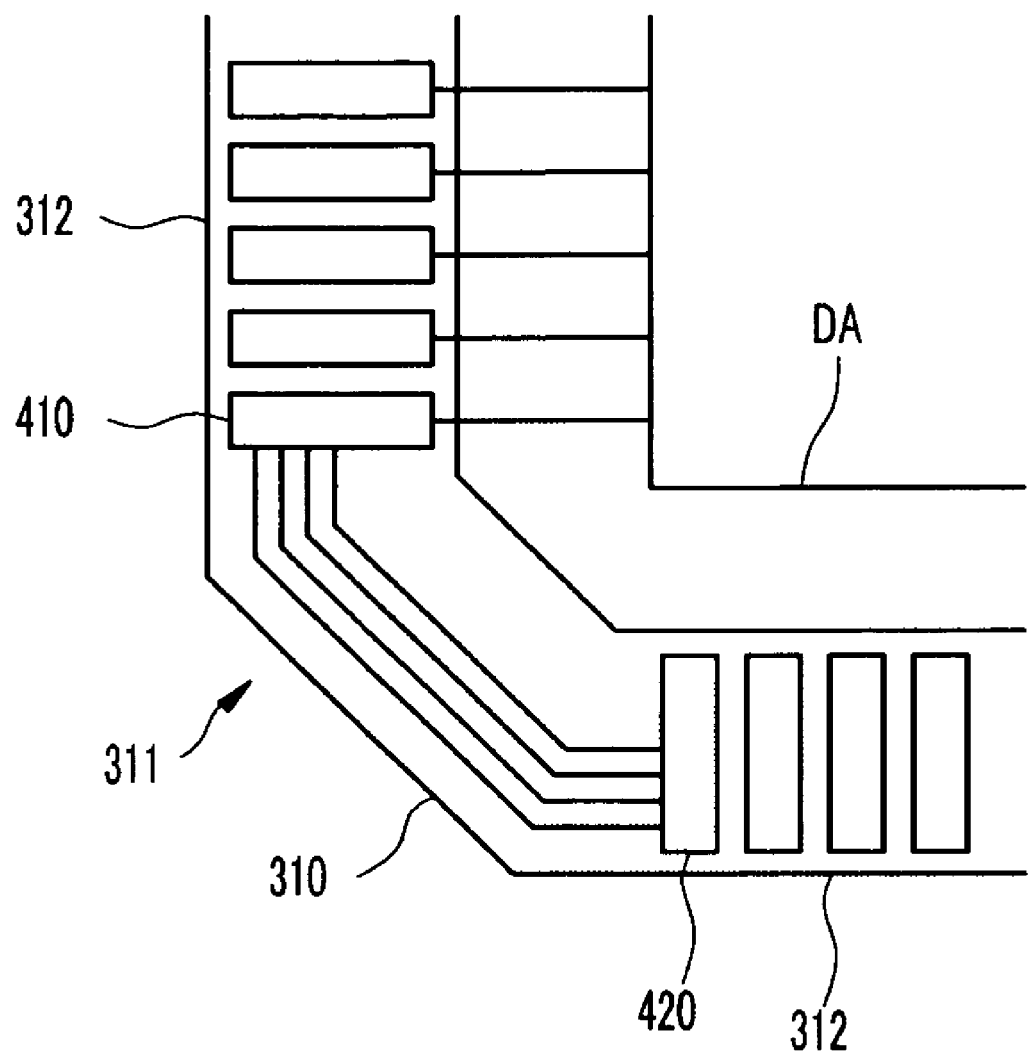
FIG. 8 is a plan view illustrating in detail the liquid crystal panel assembly shown in FIG. 7.

Next, a liquid crystal panel assembly according to another exemplary embodiment of the present invention will be described in detail with reference to FIGS. 7 and 8. FIG. 7 is a top plan view illustrating a liquid crystal panel assembly according to an exemplary embodiment of the present invention, and FIG. 8 is a top plan view illustrating in detail an edge portion of the liquid crystal panel assembly shown in FIG. 7. Since the structure shown in FIG. 7 is substantially similar to the cross-sectional structure shown in FIG. 5, components shown in FIG. 7 have the same reference numerals as those shown in FIG. 5.

Referring to FIGS. 7 and 8, a liquid crystal panel assembly according to an exemplary embodiment of the present invention includes a thin film transistor array panel 100, a common electrode panel 200, a liquid crystal layer 3 interposed between the two display panes 100 and 200, and a sealant 310 for sealing the liquid crystal layer 3. The liquid crystal panel assembly 300 includes a display area DA for displaying images and a peripheral area PA disposed at one side of the display area DA. A data driver 500 connected to data lines $D_1$ to $D_m$ is provided in the peripheral area PA of a substrate 110. For example, gate lines $G_1$ to $G_n$, the data lines $D_1$ to $D_m$ intersecting the gate lines $G_1$ to $G_n$, thin film transistors (not shown) connected to the gate lines $G_1$ to $G_n$ and the data lines $D_1$ to $D_m$, and pixel electrodes 191 connected to the thin film transistors are formed in the display area DA of the substrate 110.

Gate drivers 400L, 400R, and 400D are formed in the peripheral areas PA as integrated circuits. Each of the gate drivers 400L, 400R, and 400D includes a plurality of gate driving circuits 410 and 420. More specifically, the first and second gate drivers 400L and 400R are formed in the peripheral areas PA disposed at both sides of the display area DA, and the third gate driver 400D is formed in the peripheral area PA disposed at the lower side of the display area DA. The third gate driver 400D may be formed in a portion of the peripheral area PA at the lower side of the display area DA. Signal lines for connecting the data driver 500 to the display area DA are formed in the peripheral area PA disposed at the upper side of the display area DA. The first and second gate drivers 400R and 400L are connected to the gate lines $G_1$ to $G_n$ formed in the display area DA to substantially apply gate signals to the gate lines $G_1$ to $G_n$. The third gate driver 400D is a dummy driver for compensating for the step difference between the display area DA and the peripheral areas PA having the first and second gate drivers 400R and 400L formed therein. Therefore, the third gate driver 400D is not connected to the gate lines $G_1$ to $G_n$ formed in the display area DA. The third gate driver 400D is connected to the first gate driver 400L and the the second gate driver 400R via wirings made of the same material as the gate lines or data lines. The signal lines for connecting the data lines $D_1$ to $D_m$ to the data driver 500 are not formed in the peripheral area PA disposed at the upper side of the display area DA. Therefore, the compensation for the step difference is not needed in the upper peripheral area PA.

As shown in FIG. 7, the data driver 500 is provided in the peripheral area PA disposed at the upper side of the display area DA, and the third gate driver 400D is provided in the peripheral area PA disposed at the lower side of the display area DA. However, the positional relationship between the data driver 500 and the third gate driver 400D may be changed. Meanwhile, the first and second gate drivers 400L and 400R are connected to the third gate driver 400D. The sealant 310 is formed in the periphery of the display area DA, and edge portions 311 of the sealant 310 are rounded or chamfered, in view of a subsequent process. The gate drivers 400 are not formed at the edge portions 311 of the sealant 310. That is, the first and second gate drivers 400L and 400R are formed along portions 312 of the sealant 310 parallel to straight portions of the display area DA, and the gate drivers 400 are not provided in the edge portions 311 that are bent from the portions 312 of the sealant 310 parallel to the straight portions of the display area DA. Therefore, the gate drivers 400 are completely covered with the sealant 310. In this way, it is possible to prevent the gate drivers 400 from being exposed to the outside and being corroded. The common electrode panel 200 is bonded to the thin film transistor array panel 100 by the sealant 310. A light shielding layer 220 is formed on a substrate 210 of the common electrode panel 200, and a common electrode 270 is formed on the light shielding layer 220. Color filters (not shown) may be formed between the substrate 210 and the common electrode 270. Alternatively, the color filters may be formed on the thin film transistor array panel 100.

Figure 9:
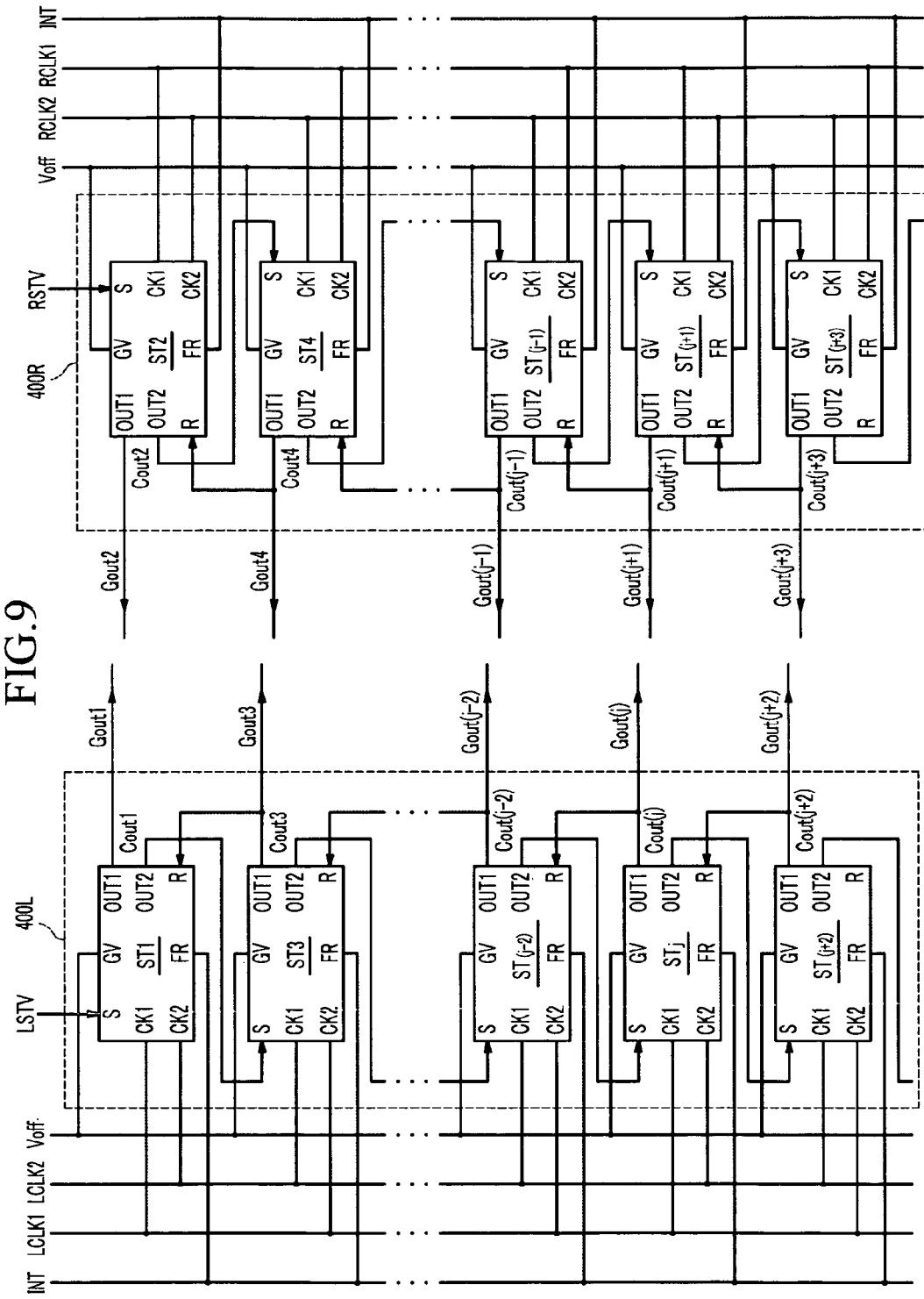
FIG. 9 is a block diagram illustrating a gate driver according to an exemplary embodiment of the present invention.
Figure 10:
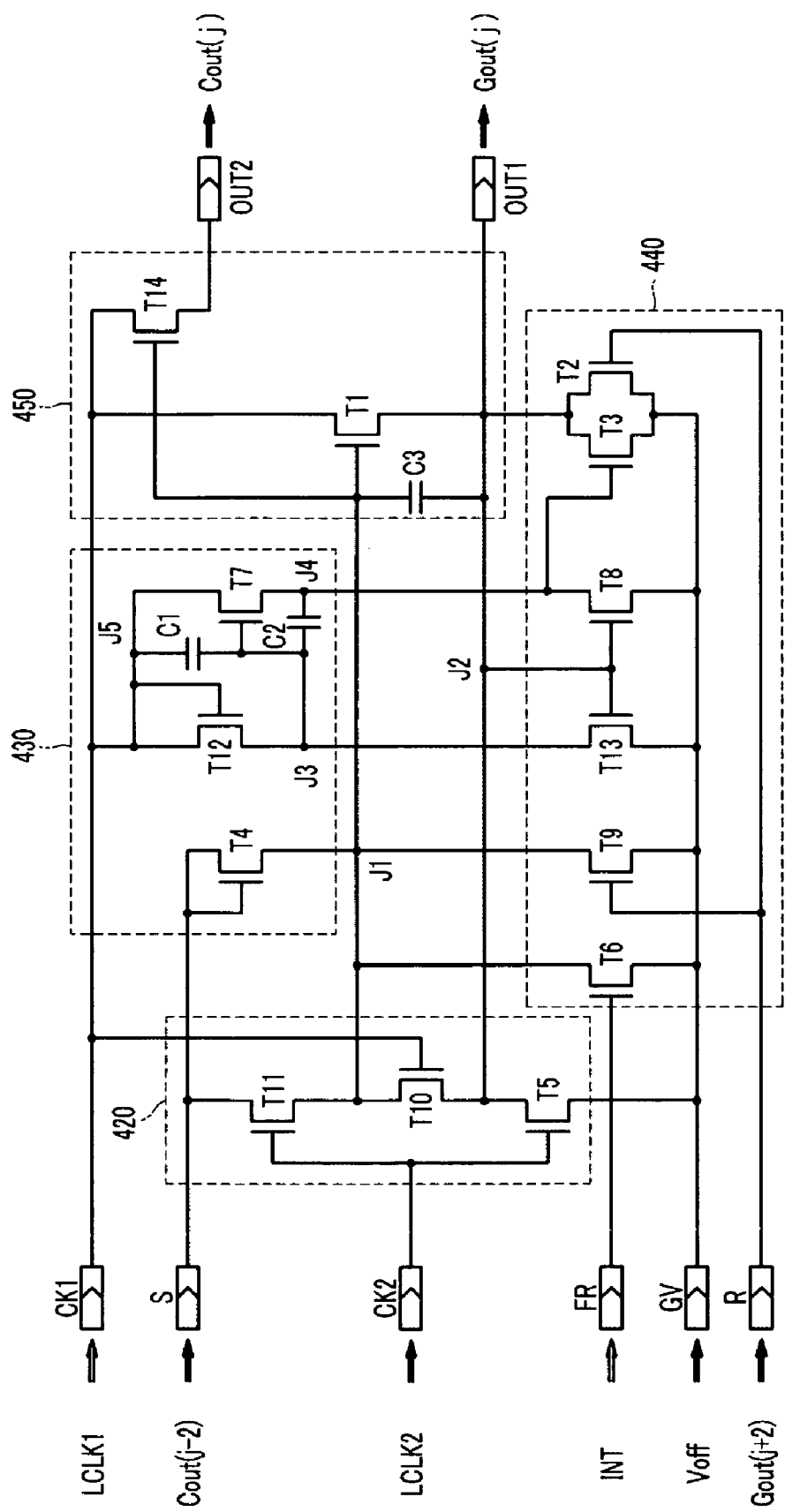
FIG. 10 is a circuit diagram illustrating a j-th stage of a shift register for a gate driver shown in FIG. 7.

Next, a gate driver 400 of a liquid crystal panel assembly according to an exemplary embodiment of the present invention will be described in detail with reference to FIGS. 9 and 10. FIG. 9 is a block diagram illustrating a gate driver according to an exemplary embodiment of the present invention, and FIG. 10 is a circuit diagram illustrating a j-th stage of a shift register for a gate driver according to an exemplary embodiment of the present invention. Referring to FIGS. 9 and 10, first and second scanning start signals LSTV and RSTV, and first to fourth clock signals LCLK1, RCLK1, LCLK2, and RCLK2 are input to shift registers 400L and 400R, serving as the gate drivers 400, respectively. Each of the shift registers 400L and 400R includes a plurality of stages ST1 to STj+3 connected to the gate lines. The plurality of stages ST1 to STj+3 are connected to one another in a cascade manner, and are supplied with the first and second scanning start signals LSTV and RSTV and the first to fourth clock signals LCLK1, RCLK1, LCLK2, and RCLK2.

The first scanning start signal LSTV input to the left shift register 400L and the second scanning start signal RSTV input to the right shift register 400R are signals having one frame period in which a pulse having a width of 1 H is included in one frame. In each of the shift registers 400L and 400R, different clock signals LCLK1, RCLK1, LCLK2, and RCLK2 are input to two adjacent stages. For example, the first clock signal LCLK1 is input to the first stage of the left shift register 400L, and the third clock signal LCLK2 is input to the second stage thereof. The second clock signal RCLK1 is input to the first stage of the right shift register 400R, and the fourth clock signal RCLK2 is input to the second stage thereof. When each of the clock signals LCLK1, RCLK1, LCLK2, and RCLK2 is at a high level, it may be the gate-on voltage Von for driving the switching element Q of the pixel. Conversely, when the clock signals are at low levels, they may be gate-off voltages Voff.

Each of the stages has a set terminal S, a gate voltage terminal GV, a pair of clock terminals CK1 and CK2, a reset terminal R, a frame reset terminal FR, a gate output terminal OUT1, and a carry output terminal OUT2. For example, a carry output Cout(j−2) of a previous stage ST(j−2) is input to the set terminal S of a j-th stage STj, and a gate output Gout(j+2) of the next stage ST(j+2) is input to the reset terminal R of the j-th stage STj. In addition, the clock signals LCLK1 and LCLK2 are input to the clock terminals CK1 and CK2 of the j-th stage STj, respectively, and the gate-off voltage Voff is input to the gate voltage terminal GV thereof. The gate output terminal OUT1 outputs a gate output Gout(j), and the carry output terminal OUT2 outputs a carry output Cout (j). However, instead of the previous carry out, the scanning start signals LSTV and RSTV are input to the first stages of the shift registers 400L and 400R, respectively. In addition, when the clock signal LCLK1 is input to the clock terminal CK1 of the j-th stage STj and the clock signal LCLK2 is input to the clock terminal CK2 thereof, the clock signal LCLK2 is input to the clock terminals CK1 of the (j−2)-th and (j+2)-th stages ST(j−2) and ST(j+2) adjacent to the j-th stage STj, and the clock signal LCLK1 is input to the clock terminals CK2 thereof.

Referring to FIG. 10, each stage, for example, the j-th stage, of the gate driver 400 according to an exemplary embodiment of the present invention includes an input section 420, a pull-up driver 430, a pull-down driver 440, and an output section 450. These components each include at least one NMOS transistor T1 to T14, and the pull-up driver 430 and the output section 450 further include capacitors C1 to C3. However, PMOS transistors may be used instead of the NMOS transistors. The capacitors C1 to C3 may be substantially parasitic capacitances between a gate and a drain/source formed in the manufacturing process. The input section 420 includes three transistors T11, T10, and T5 connected in series between the set terminal S and the gate voltage terminal GV. The gate of each of the transistors T11 and T5 is connected to the clock terminal CK2, and the gate of the transistor T10 is connected to the clock terminal CK1. A connection point between the transistor T11 and the transistor T10 is connected to a connection point J1, and a connection point between the transistor T10 and the transistor T5 is connected to a connection point J2.

The pull-up driver 430 includes the transistor T4 connected between the set terminal S and the connection point J1, the transistor T12 connected between the clock terminal CK1 and a connection point J3, and the transistor T7 connected between the clock terminal CK1 and a connection point J4. The gate and the drain of the transistor T4 are connected to the set terminal S, and the source thereof is connected to the connection point J1. The gate and the drain of the transistor T12 are connected to the clock terminal CK1, and the source thereof is connected to the connection point J3. The gate of the transistor T7 is connected to the connection point J3 and is also connected to the clock terminal CK1 through the capacitor C1. In addition, the drain of the transistor T7 is connected to the clock terminal CK1, and the source thereof is connected to the connection point J4. A capacitor C2 is connected between the connection points J3 and J4.

The pull-down driver 440 includes a plurality of transistors T6, T9, T13, T8, T3, and T2 that receive the gate-off voltage Voff and output it to the connection points J1, J2, J3, and J4 through their drains. The gate of the transistor T6 is connected to the frame reset terminal FR, and the drain thereof is connected to the connection point J1. The gate of the transistor T9 is connected to the reset terminal R, and the drain thereof is connected to the connection point J1. The gates of the transistors T13 and T8 are connected to the connection point J2, and the drains thereof are connected to the connection points J3 and J4, respectively. The gate of the transistor T3 is connected to the connection point J4, and the gate of the transistor T2 is connected to the reset terminal R. The drains of the two transistors T3 and T2 are connected to the connection point J2.

The output section 450 includes a pair of transistors T1 and T14 each having a drain and a source respectively connected between the clock terminal CK1 and the output terminals OUT1 and OUT2 and a gate connected to the connection point J1, and the capacitor C3 connected between the gate and the drain of the transistor T1, that is, between the connection points J1 and J2. The source of the transistor T1 is connected to the connection point J2. Next, the operation of this stage will be described as follows. For better comprehension and ease of description, a voltage corresponding to the high level of the clock signal LCLK1, LCKL2, RCLK1, or RCLK2 is referred to as a high voltage, and a voltage corresponding to the low level of the clock signal LCLK1, LCLK2, RCLK1, or RCLK2 is referred to as a low voltage. The level of the low voltage is equal to that of the gate-off voltage Voff.

First, when the clock signal LCLK2 and the previous carry output Cout(j−2) change to high levels, or go high, the transistors T11, T5, and T4 are turned on. Then, the two transistors T11 and T4 transmit the high voltage to the connection point J1, and the transistor T5 transmits the low voltage to the connection point J2. The transistors T1 and T14 are turned on to cause the clock signal CLK1 to be output from the output terminals OUT1 and OUT2. At that time, since the voltage levels of the connection point J2 and the clock signal LCLK1 are low, the output voltages Gout(j) and Cout(j) become low. Simultaneously, the capacitor C3 is charged with a voltage corresponding to the difference between the high voltage and the low voltage. In this case, since the clock signal LCLK1 and the next gate output Gout(j+2) are at low levels and the connection point J2 is at a low level, the transistors T10, T9, T12, T13, T8, and T2 having gates connected to one another are in an off state.

When the clock signal LCLK2 changes to a low level, or goes low, the transistors T11 and T5 are turned off. At that time, when the clock signal LCLK1 changes to a high level, the output voltage of the transistor T1 and the voltage of the connection point J2 change to high levels. At this time, a high voltage is applied to the gate of the transistor T10, and the potential of the source connected to the connection point J2 is at a high level. Therefore, the potential difference between the gate and the source is zero, and thus the transistor T10 is kept in an off state. Therefore, the connection point J1 is in a floating state, and thus the potential increases by the high voltage by means of the capacitor C3.

Meanwhile, since the potentials of the clock signal LCLK1 and the connection point J2 are at high levels, the transistors T12, T13, and T8 are turned on. In this state, the transistor T12 and the transistor T13 are connected in series to each other between the high voltage and the low voltage, and thus the connection point J3 has a voltage value divided by resistance values when the transistors T12 and T13 are turned on. However, if the resistance value when the transistor T13 is turned on is significantly higher than that when the transistor T12 is turned on, for example, if the resistance value when the transistor T13 is turned on is ten thousand times higher than that when the transistor T12 is turned on, the voltage of the connection point J3 is substantially equal to the high voltage. Therefore, the transistor T7 is turned on and then connected in series to the transistor T8, which causes the connection point J4 to have a voltage value divided by resistance values when the two transistors T7 and T8 are turned on. At this time, when the resistance values when the transistors T7 and T8 are turned on are set to be substantially equal to each other, the connection point J4 has an intermediate voltage value between the high voltage and the low voltage, which causes the transistor T3 to be kept in an off state. At that time, since the next gate output Gout(j+2) is at a low level, the transistors T9 and T2 are also kept in an off state. Therefore, the output terminals OUT1 and OUT2 are connected to only the clock terminal CK1 and are disconnected from the low voltage terminal, so that a high voltage is output from the output terminals OUT1 and OUT2. Meanwhile, the capacitor C1 and the capacitor C2 are charged with a voltage corresponding to the potential difference therebetween, and the voltage of the connection point J3 is lower than that of the connection point J5.

Subsequently, when the next gate output Gout(j+1) and the clock signal CLK2 turn to high levels and the clock signal CLK1 changes to a low level, the transistors T9 and T2 are turned on to apply a low voltage to the connection points J1 and J2. At that time, the voltage of the connection point J1 drops to a low level due to the discharge of the capacitor C3, and the discharge of the capacitor C3 causes a predetermined amount of time to be required, or introduces a delay, for the voltage to drop to the low level. Therefore, after the next gate output Gout(j+1) changes to a high level, the two transistors T1 and T14 are kept on for a period of time, so that the output terminals OUT1 and OUT2 are connected to the clock terminal CK1, and the low voltage is output from the output terminals OUT1 and OUT2. When the capacitor C3 is completely discharged and the potential of the connection point J1 reaches a low level, the transistor T14 is turned off causing the output terminal OUT2 to be effectively disconnected from the clock terminal CK1. Therefore, the carry output Cout(j) becomes a floating state, and thus the low voltage is kept. At the same time, the output terminal OUT1 is connected to the low voltage terminal through the transistor T2 even when the transistor T1 is turned off. Therefore, the low voltage is continuously output from the output terminal OUT1.

Meanwhile, when the transistors T12 and T13 are turned off, the connection point J3 becomes a floating state. In addition, the voltage of the connection point J5 is lower than the voltage of the connection point J4, and the voltage of the connection point J3 is kept lower than the voltage of the connection point J5 by the capacitor C1, which causes the transistor T7 to be turned off. At the same time, the transistor T8 is turned off, and the voltage of the connection point J4 is lowered, or brought low, which causes the transistor T3 to be kept in an off state. Further, since the low level clock signal CLK1 is input to the gate of the transistor T10 and the voltage of the connection point J2 is low, the transistor T10 is kept in an off state. Then, when the clock signal CLK1 changes to a high level, the transistors T12 and T7 are turned on, and the voltage of the connection point J4 increases, which causes the transistor T3 to be turned on. Then, the low voltage is transmitted to the connection point J2, and thus the low voltage is continuously output from the output terminal OUT1. That is, even when the next gate output Gout(j+1) is at a low level, the voltage of the connection point J2 can be at a low level.

Meanwhile, since the high level clock signal CLK1 is input to the gate of the transistor T10 and the voltage of the connection point J2 is low, the transistor T10 is turned on, and thus the low voltage of the connection point J2 is applied to the connection point J1. Meanwhile, since the drains of the two transistors T1 and T14 are connected to the clock terminal CK1, the clock signal CLK1 is continuously supplied to the drains. Particularly, the size of the transistor T1 is larger than those of the other transistors, which introduces a parasitic capacitance between the gate and the drain of the transistor T1. As a result, a variation in the voltage of the drain may affect the gate voltage. Therefore, when the clock signal CLK1 changes to a high level, the gate voltage increases due to the parasitic capacitance between the gate and the drain, which may cause the transistor T1 to be turned on. Thus, the gate voltage of the transistor T1 is kept at a low level by applying the low voltage of the connection point J2 to the connection point J1, which prevents the transistor T1 from being turned on.

Thereafter, the voltage of the connection point J1 is kept at a low level until the next carry output Cout(j−2) changes to a high level. The voltage of the connection point J2 becomes low through the transistor T3 when the clock signal CLK1 is at a high level and the clock signal CLK2 is at a low level. The voltage of the connection point J2 is kept at a low level through the transistor T5 when the clock signal CLK1 is at a low level and the clock signal CLK2 is at a high level. Meanwhile, the transistor T6 receives an initializing signal INT generated in the last dummy stage (not shown) and transmits the gate-off voltage Voff to the connection point J1, thereby setting the voltage of the connection point J1 to a low voltage again. In this way, the stage 410 generates the carry signal Cout(j) and the gate signal Gout(j), on the basis of the previous carry signal Cout(j−2) and the next gate signal Gout(j+2), in synchronization with the clock signals LCLK1 and LCLK2.

Figure 11:
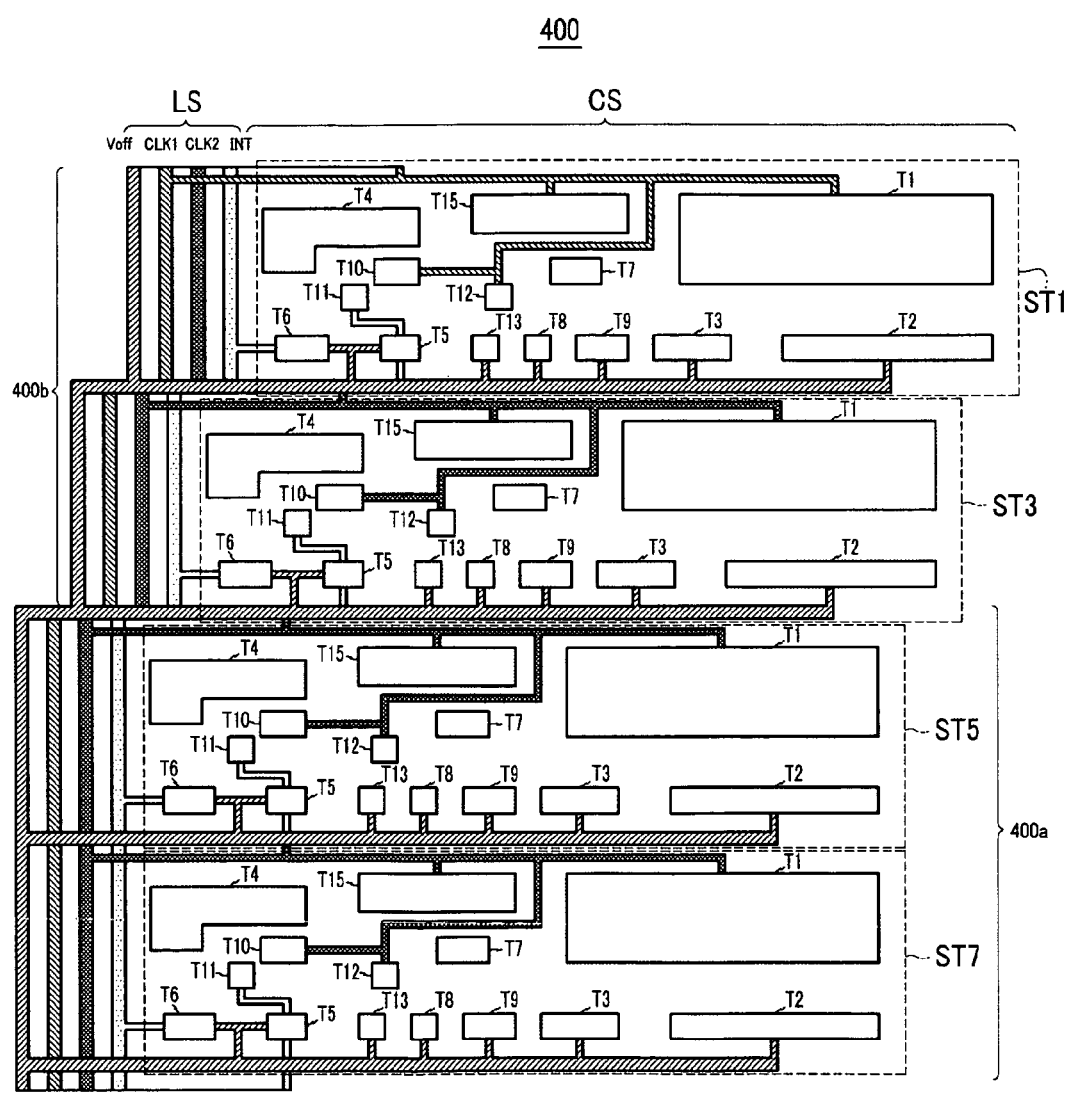
FIG. 11 is a layout view schematically illustrating a gate driver shown in FIG. 4.
Figure 12:
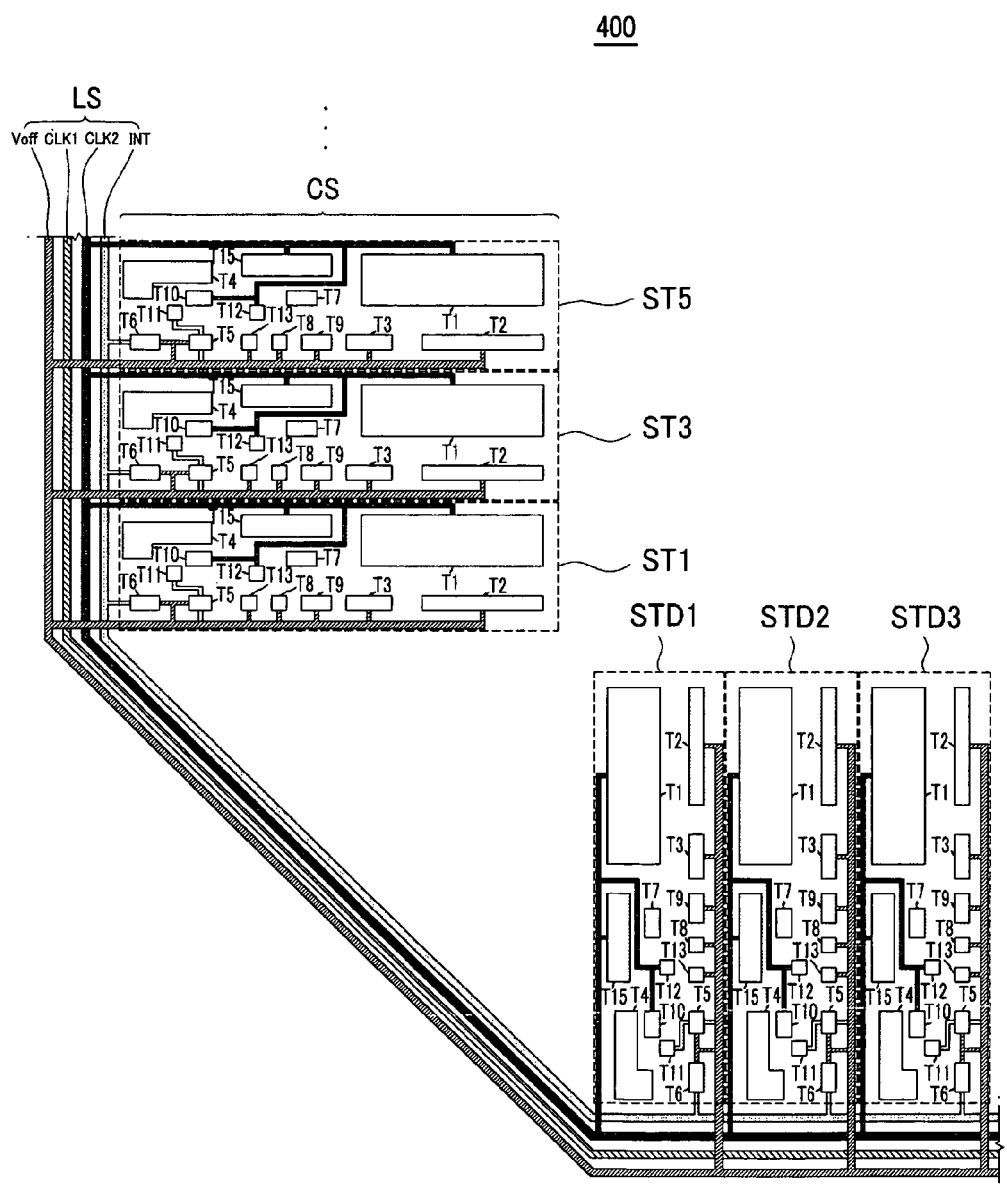
FIG. 12 is a layout view schematically illustrating a gate driver shown in FIG. 7.

Next, the arrangement of the gate driver 400 on the thin film transistor array panel 100 shown in FIGS. 4 and 1 will be described in detail with reference to FIGS. 11 and 12, respectively. FIG. 11 is a layout view schematically illustrating the gate driver 400 shown in FIG. 4, and FIG. 12 is a layout view schematically illustrating the gate driver 400 shown in FIG. 7. Referring to FIG. 11, the gate driver 400 according to an exemplary embodiment of the invention includes circuit portions CS composed of the stages ST1 to STj+3 and wiring portions LS for transmitting various signals Voff, LCKV1, RCKV1, LCKV2, RCKV2, and INT input to the stages ST1 to STj+3. However, only the gate driver 400 formed on the left of the display area DA is shown in FIG. 11.

Each of the wiring portions LS includes a gate-off voltage line SL1 for transmitting the gate-off voltage Voff, first and second clock signal lines SL2 and SL3 for transmitting the first and second clock signals LCKV1, RCKV1, LCKV2, and RCKV2, respectively, and an initializing signal line SL4 for transmitting the initializing signal INT. The signal lines SL1 to SL4 extend substantially in the vertical direction. The gate-off voltage line SL1, the clock signal lines SL2 and SL3, and the initializing signal line SL4 are arranged in this order from the left, so that the initializing signal line SL4 is closest to the shift register 400, followed by the clock signal lines SL3 and SL2 and the gate-off voltage line SL1. The positional relationship between the gate-off voltage line SL1 and the initializing signal line SL4 may be changed. In addition, the signal lines SL1 to SL4 have extension lines extending toward the stages ST1, ST3, ST5, and ST7 in the horizontal direction. The extension lines of the gate-off voltage line SL1 and the initializing signal line SL4 extend toward each of the stages ST1, ST3, ST5, and ST7. The extension lines of the first and second clock signal lines SL2 and SL3 alternately extend toward the stages ST1, ST3, ST5, and ST7 at boundaries among the stages ST1, ST3, ST5, and ST7.

In the arrangement of the transistors T1 to T13 and T15 in the first stage ST1 among the stages ST1, ST3, ST5, and ST7 in the circuit portions CS, the transistor T4 to which the previous carry signal Cout(j−1) is input is disposed at the upper left side of the first stage ST, which is closest to the previous stage, and the transistors T1 and T15 to which the first clock signal LCKV1 is input are arranged along the extension line of the first clock signal line SL2 which extends in the horizontal direction above the transistors T1 and T15. In addition, the transistors T7, T10, and T12 to which the first clock signal LCKV1 is input are disposed below the transistor T15. The transistors T11 and T5 are disposed at a lower left side of the first stage ST1 and are connected to the extension line of the second clock signal line SL3 in the next stage so as to receive the second clock signal LCKV2. The transistor T6 that is connected to the initializing signal line SL4 extending from the left and receives the initializing signal INT is arranged at the leftmost side. The transistors T2, T3, T8, T9, and T13 to which the gate-off voltage Voff is input are disposed at the lower side of the first stage ST1 along the extension line of the gate-off voltage line SL1 extending in the horizontal direction.

In the third stage ST3 adjacent to the first stage ST1, the arrangement of the transistors is similar to the arrangement of the transistors in the first stage ST1 except that the first clock signal line SL2 and the first clock signal LCKV1 are replaced with the second clock signal line SL3 and the second clock signal LCKV2, respectively, and the second clock signal line SL3 and the second clock signal LCKV2 are replaced with the first clock signal line SL2 and the first clock signal LCKV1, respectively. Some of the circuit portions CS and the wiring portions LS are arranged in a line, and the other circuit portions CS and wiring portions LS are not aligned with the circuit portions CS and the wiring portions LS arranged in a line in the vertical direction. That is, the first stage ST1 is closest to the display area DA, followed by the third stage ST3 and the fifth stage ST5. The distance between the fifth stage ST5 and the display area DA is the largest. The following stages from the seventh stage ST7 on are aligned with the fifth stage ST5. Therefore, the wiring portions LS in adjacent stages from the fifth stage ST5 on are arranged in a line. However, the wiring portion LS adjacent to the third stage ST3 is bent toward the display area DA and is not aligned with the wiring portion LS adjacent to the fifth stage ST5, and the wiring portion LS adjacent to the first stage ST1 is bent toward the display area DA and is not aligned with the wiring portion LS adjacent to the third stage ST3. Thus, the gate driver 400 has the first region 400a in which the wiring portions LS are arranged in a line and the second region 400b not aligned with the first region 400a. The first and third stages ST1 and ST3 and the wiring portions LS adjacent thereto form the second region 400b, and the fifth and seventh stages ST5 and ST7 and the wiring portions LS adjacent thereto form the first region 400a. Although not shown in detail in FIG. 11, as shown in FIG. 4, the lower part of the gate driver 400 has the same structure as that shown in FIG. 11.

According to one or more embodiments of the present invention, the gate driver integrated into the display panel can be covered with the sealant at the edge portions of the sealant. Therefore, it is possible to effectively protect the gate driver from external environments. Referring to FIG. 12, the gate driver 400 according to the exemplary embodiment of the present invention includes the circuit portions CS composed of the stages ST1 to STj+3 and the wiring portions LS for transmitting various signals Voff, LCKV1, RCKV1, LCKV2, RCKV2, and INT input to the stages ST1 to STj+3. However, only the gate driver 400 formed at the left side of the display area DA is shown in FIG. 12.

Each of the wiring portions LS includes a gate-off voltage line SL1 for transmitting the gate-off voltage Voff, first and second clock signal lines SL2 and SL3 for transmitting the first and second clock signals LCKV1, RCKV1, LCKV2, and RCKV2, respectively, and an initializing signal line SL4 for transmitting the initializing signal INT. The signal lines SL1 to SL4 extend substantially in the vertical direction. The gate-off voltage line SL1, the clock signal lines SL2 and SL3, and the initializing signal line SL4 are arranged in this order from the left, so that the initializing signal line SL4 is closest to the shift register 400, followed by the clock signal lines SL3 and SL2 and the gate-off voltage line SL1. The positional relationship between the gate-off voltage line SL1 and the initializing signal line SL4 may be changed. In addition, the signal lines SL1 to SL4 have extension lines extending toward the stages ST1, ST3, ST5, and ST7 in the horizontal direction. The extension lines of the gate-off voltage line SL1 and the initializing signal line SL4 extend toward each of the stages ST1, ST3, ST5, and ST7.

The extension lines of the first and second clock signal lines SL2 and SL3 alternately extend toward the stages ST1, ST3, ST5, and ST7 at boundaries among the stages ST1, ST3, ST5, and ST7.

In the arrangement of transistors T1 to T13 and T15 in the first stage ST1 among the stages ST1, ST3, ST5, and ST7 in the circuit portions CS, the transistor T4 to which the previous carry signal Cout(j−1) is input is disposed at the upper left side of the first stage ST1, which is closest to the previous stage, and the transistors T1 and T15 to which the first clock signal LCKV1 is input are arranged along the extension line of the first clock signal line SL2 that extends in the horizontal direction above the transistors T1 and T15. In addition, the transistors T7, T10, and T12 to which the first clock signal LCKV1 is input are disposed below the transistor T15. The transistors T11 and T5 are disposed at a lower left side of the first stage ST1 and are connected to the extension line of the second clock signal line SL3 in the next stage so as to receive the second clock signal LCKV2. The transistor T6 that is connected to the initializing signal line SL4 extending from the left and receives the initializing signal INT is arranged at the leftmost side. The transistors T2, T3, T8, T9, and T13 to which the gate-off voltage Voff is input are disposed at the lower side of the first stage ST1 along the extension line of the gate-off voltage line SL1 extending in the horizontal direction. In the third stage ST3 adjacent to the first stage ST1, the arrangement of the transistors is similar to the arrangement of the transistors in the first stage ST1 except that the first clock signal line SL2 and the first clock signal LCKV1 are replaced with the second clock signal line SL3 and the second clock signal LCKV2, respectively, and the second clock signal line SL3 and the second clock signal LCKV2 are replaced with the first clock signal line SL2 and the first clock signal LCKV1, respectively. A description of the fifth stage ST5 will be omitted.

The wiring portion LS of the first gate driver 400L connected to the display area DA is connected to the wiring portion LS of the third gate driver 400D not connected to the display area DA. The first gate driver 400L is driven by the above-mentioned driving method. For example, the gate driving circuit disposed at the lowermost side may be driven first. As described above, the stage generates a self-carry signal and a self-gate signal, on the basis of the previous carry signal and the next gate signal, in synchronization with the clock signal. At that time, the first stage ST1 receives the initializing signal, instead of the previous carry signal, and the initializing signal may be supplied from the dummy stage. When the first stage ST1 is driven last, the self-carry signal may be transmitted to the next stage. In this way, it is possible to prevent an error in the gate signal output from the gate driver 400. However, in the liquid crystal display according to one or more embodiments of the present invention, the gate driving circuit is not provided at the edge of the sealant 310. Therefore, a gate driving circuit serving as the dummy stage is needed. When the wiring portion LS of the lowermost gate driving circuit, which is driven first, of the first gate driver 400L is connected to the wiring portion LS of a first stage STD1 of the third gate driver 400D, the circuit portion CS of the first gate driving circuit of the third gate driver 400D, that is, a stage STD1, can be used as the dummy stage. Stages adjacent to the first stage STD1 are denoted by characters STD2 and STD3. Therefore, the third gate driver 400D has a function of compensating for the step difference of the substrate 110 and also has a function of assisting the driving of the first and second gate drivers 400L and 400R. According to one or more embodiments of the present invention, the gate driver integrated into the display panel can be covered with the sealant at the edge of the sealant. Therefore, it is possible to effectively protect the gate driver from external environments.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the claims.

What is claimed is:

1. A liquid crystal display, comprising:
a substrate;
at least one pixel disposed on the substrate, the pixel including at least one switching element;
at least one gate line connected to the switching elements and extending in a first direction; and
at least one gate driver including a first group of stages and a second group of stages,
wherein one stage of the first group of stages and the second group of stages is connected to the gate line,
wherein the first group of stages and the second group of stages are integrated on a same side of the substrate,
wherein an edge of the substrate extends in a second direction that is not aligned with the first direction and is not parallel to the first direction, and
wherein a distance between the first group of stages and the edge of the substrate is different from a distance between the second group of stages and the edge of the substrate.

2. The liquid crystal display of claim 1, wherein the second group of stages comprises a third group of stages and a fourth group of stages, arranged at both sides of the first group of stages, respectively.

3. The liquid crystal display of claim 1, wherein the distance between the first group of stages and the edge of the substrate is less than the distance between the second group of stages and the edge of the substrate.

4. The liquid crystal display of claim 1, wherein the gate driver further comprises at least one wiring portion connected to the first group of stages and the second group of stages.

5. The liquid crystal display of claim 4, wherein the wiring portion has a bent portion at a position in which the wiring portion is connected to at least one of the first group of stages and the second group of stages.

6. The liquid crystal display of claim 4, further comprising a sealant that is formed so as to surround the pixel.

7. The liquid crystal display of claim 6, wherein the sealant covers at least one portion of the first group of stages and the second group of stages.

8. The liquid crystal display of claim 6, wherein the sealant covers the wiring portion.

9. The liquid crystal display of claim 4, wherein a distance between the wiring portion connected to the first group of stages and the wiring portion connected to the second group of stages is smaller than 300 μm.

10. A liquid crystal display, comprising:
a liquid crystal panel assembly, the liquid crystal panel assembly comprising:
a first substrate,
a second substrate which is bonded to the first substrate by a fastening member,
at least one pixel including at least one switching element, and at least one gate line connected to the at least one switching element and extending in a first direction; and at least one gate driver including a first group of stages and a second group of stages, the second group of stages comprising at least one stage, wherein one of the stages is connected to the gate line, and the first group of stages and the second group of stages are integrated on a same side of the substrate, wherein an edge of the substrate extends in a second direction that is not aligned with the first direction and is not parallel to the first direction, and wherein a distance between the first group of stages and the edge of the substrate is different from a distance between the second group of stages and the edge of the substrate.

11. The liquid crystal display of claim 2, wherein the distance between the first group of stages and the edge of the substrate is less than the distance between the second group of stages and the edge of the substrate.

12. The liquid crystal display of claim 2, wherein the gate driver further comprises at least one wiring portion connected to the first group of stages and the second group of stages.

13. The liquid crystal display of claim 2, further comprising a sealant that is formed so as to surround the pixel.

14. The liquid crystal display of claim 3, wherein the gate driver further comprises at least one wiring portion connected to the first group of stages and the second group of stages.

15. The liquid crystal display of claim 3, further comprising a sealant that is formed so as to surround the pixel.

16. The liquid crystal display of claim 1, further comprising a sealant that is formed so as to surround the pixel.

17. The liquid crystal display of claim 16, wherein the second group of stages is disposed on an area corresponding to a rounded or chamfered portion of the sealant.

18. The liquid crystal display of claim 16, wherein the sealant covers at least one portion of the first group of stages and the second group of stages.

19. The liquid crystal display of claim 16, wherein the sealant covers the wiring portion.

20. The liquid crystal display of claim 1, wherein the first direction is a row direction.

21. The liquid crystal display of claim 10, wherein the second group of stages comprises a third group of stages and a fourth group of stages, arranged at both sides of the first group of stages, respectively.

22. The liquid crystal display of claim 21, wherein the gate driver further comprises at least one wiring portion connected to the first group of stages and the second group of stages.

23. The liquid crystal display of claim 21, wherein the second group of stages is disposed on an area corresponding to a rounded or chamfered portion of the fastening member.

24. The liquid crystal display of claim 10, wherein the gate driver further comprises at least one wiring portion connected to the first group of stages and the second group of stages.

25. The liquid crystal display of claim 24, wherein the wiring portion has a bent portion at a position in which the wiring portion is connected to at least one of the first group of stages and the second group of stages.

26. The liquid crystal display of claim 24, wherein the second group of stages is disposed on an area corresponding to a rounded or chamfered portion of the fastening member.

27. The liquid crystal display of claim 10, wherein the second group of stages is disposed on an area corresponding to a rounded or chamfered portion of the fastening member.

28. The liquid crystal display of claim 27, wherein the sealant member covers at least one portion of the first group of stages and the second group of stages.

29. The liquid crystal display of claim 28, wherein the sealant member covers the wiring portion.

30. The liquid crystal display of claim 1, wherein at least one of the stages comprises:
 a pull-up driver including a first transistor provided with a signal from one of previous stages or a scanning start signal;
 an output section including a second transistor which outputs a gate signal in response to an output of the first transistor; and
 a pull-down driver including a third transistor which turns off the second transistor in response to a signal of one of next stage.

31. The liquid crystal display of claim 4, the wiring portion comprises at least one of a gate-off voltage line, a first clock signal line and a second clock signal line.

32. The liquid crystal display of claim 10, wherein the second group of stages comprises a first stage and a second stage which are disposed at one side of the first group of stages, a distance between the first stage and the edge of the substrate is different from a distance between the second stage and the edge of the substrate.

33. The liquid crystal display of claim 24, wherein the wiring portion comprises a first portion which is adjacent to the first group of stages in the first direction and a second portion which is adjacent to the second group of stages in the first direction, wherein a distance between the first portion and the edge of the substrate is different from a distance between the second portion and the edge of the substrate.

34. The liquid crystal display of claim 33, wherein the distance between the first portion and the edge of the substrate is less than the distance between the second portion and the edge of the substrate.

35. A liquid crystal display, comprising:
 a substrate;
 at least one pixel disposed on the substrate, the pixel including at least one switching element;
 gate lines extended in a first direction;
 at least one first gate driver disposed on a first side of the substrate; and
 at least one second gate driver disposed on a second side of the substrate,
 wherein the first gate driver comprises a first group of stages and a second group of stages,
 wherein the first gate driver is connected to at least a portion of the gate lines, the second gate driver is connected to at least a portion of the gate lines,
 wherein an edge of the substrate extends in a second direction that is not aligned with the first direction and is not parallel to the first direction, and
 wherein a distance between the first group of stages and the edge of the substrate is different from a distance between the second group of stages and the edge of the substrate.

36. The liquid crystal display of claim 35, wherein the second group of stages comprises a third group of stages and a fourth group of stages, arranged at both sides of the first circuit portion, respectively.

37. The liquid crystal display of claim 35, wherein the second gate driver comprises a fifth group of stages and a sixth group of stages, and a distance between the fifth group of stages and the edge of the substrate is different from a distance between the sixth group of stages and the edge of the substrate.

38. The liquid crystal display of claim 37, wherein the sixth group of stages comprises a seventh group of stages and an eighth group of stages, arranged at both sides of the third group of stages, respectively.

39. The liquid crystal display of claim 35, wherein the first gate driver is connected to odd-numbered gate lines among the gate lines, and the second gate driver is connected to even-numbered gate lines among the gate lines.

40. The liquid crystal display of claim 35, wherein the first gate driver is connected to one ends of the gate lines, and the second gate driver is connected to the other ends of the gate lines.

41. The liquid crystal display of claim 1, wherein the second group of stages comprises a plurality of stages arranged at one side of the first group of stages, wherein a distance between at least one of the second group of stages is different from a distance between the other of the second group of stages and the edge of the substrate.

42. A liquid crystal display, comprising:
a substrate;
at least one pixel disposed on the substrate, the pixel including at least one switching element;
at least one gate line connected to the switching element and extending in a first direction; and
at least one gate driver including a plurality of stages integrated on a same side of the substrate,
wherein one of the stages is connected to the gate line,
wherein an edge of the substrate extends in a second direction that is not aligned with the first direction and is not parallel to the first direction, and
wherein a distance between at least one of the stages and the edge of the substrate is different from a distance between the other of the stages and the edge of the substrate.

* * * * *